(12) United States Patent
Yamashita et al.

(10) Patent No.: US 7,986,028 B2
(45) Date of Patent: Jul. 26, 2011

(54) SEMICONDUCTOR DEVICE HAVING METAL THIN FILM RESISTANCE ELEMENT

(75) Inventors: Kimihiko Yamashita, Hyogo (JP); Yasunori Hashimoto, Hyogo (JP)

(73) Assignee: Ricoh Company, Ltd., Tokyo (JP)

( * ) Notice: Subject to any disclaimer, the term of this patent is extended or adjusted under 35 U.S.C. 154(b) by 376 days.

(21) Appl. No.: 11/792,471

(22) PCT Filed: Sep. 21, 2006

(86) PCT No.: PCT/JP2006/319231
§ 371 (c)(1),
(2), (4) Date: Jun. 5, 2007

(87) PCT Pub. No.: WO2007/043340
PCT Pub. Date: Apr. 19, 2007

(65) Prior Publication Data
US 2008/0100348 A1 May 1, 2008

(30) Foreign Application Priority Data
Oct. 14, 2005 (JP) .................. 2005-299767

(51) Int. Cl.
*H01L 29/00* (2006.01)
(52) U.S. Cl. ............. 257/536; 257/537; 257/E29.001
(58) Field of Classification Search .......... 257/536, 257/537, 379, 758, E31.041, E27.101, E27.125, 257/E29.001; 324/65
See application file for complete search history.

(56) References Cited

U.S. PATENT DOCUMENTS

| | | | |
|---|---|---|---|
| 5,905,307 A | 5/1999 | Onoda | |
| 6,013,940 A | 1/2000 | Harada et al. | |
| 2005/0212085 A1 * | 9/2005 | Hashimoto et al. | 257/537 |
| 2005/0218478 A1 * | 10/2005 | Watanabe | 257/536 |
| 2005/0230833 A1 * | 10/2005 | Kato et al. | 257/758 |
| 2005/0236676 A1 * | 10/2005 | Ueno | 257/379 |

FOREIGN PATENT DOCUMENTS

| | | |
|---|---|---|
| EP | 0698923 A1 | 2/1996 |
| EP | 0741410 A2 | 11/1996 |
| JP | 63-40344 | 2/1988 |
| JP | 6-188371 | 7/1994 |
| JP | 10-78826 | 3/1998 |
| JP | 2000-150782 | 5/2000 |
| JP | 2000-208703 | 7/2000 |
| JP | 2002-124639 | 4/2002 |
| JP | 2003-37179 | 2/2003 |
| JP | 2003-243513 | 8/2003 |
| JP | 2003-303888 | 10/2003 |

* cited by examiner

*Primary Examiner* — Matthew E Warren
*Assistant Examiner* — Fang-Xing Jiang
(74) *Attorney, Agent, or Firm* — Cooper & Dunham LLP

(57) ABSTRACT

A semiconductor device, includes a lower layer side insulation film; a wiring pattern formed on the lower layer side insulation film; a base insulation film formed on the lower layer side insulation film and the wiring pattern; and a plurality of metal thin film resistance elements formed on the base insulation film; wherein a connection hole is formed in the base insulation film on the wiring pattern; the wiring pattern and the metal thin film resistance element are electrically connected in the connection hole; the metal thin film resistance element has a belt shape part arranged separately from the connection hole and a connection part continuously formed with the belt shape part and connected to the wiring pattern in the connection hole; and the connection parts of at least two of the metal thin film resistance element are formed in the single connection hole with a gap in between said connection parts.

10 Claims, 8 Drawing Sheets

SEMICONDUCTOR DEVICE HAVING METAL THIN FILM RESISTANCE ELEMENT

TECHNICAL FIELD

The present invention generally relates to semiconductor devices, and more particularly to, a semiconductor device having a structure where a lower layer side insulation film, a wiring pattern formed on the lower layer side insulation film, a base insulation film formed on the lower layer side insulation film and the wiring pattern, and plural metal thin film resistance elements formed on the base insulation film are provided; a connection hole is formed in the base insulation film on the wiring pattern; and the wiring pattern and the metal thin film resistance element are electrically connected in the connection hole.

BACKGROUND ART

In analog integrated circuits, resistance elements are frequently used as important elements. Recently, a resistance element formed by a metal thin film (hereinafter "metal thin film resistance element") in the resistance elements has attracted attention because the metal thin film resistance element has a low TCR (temperature coefficient of resistance) of a resistance value. For example, chrome silicon (CRSI), nickel chrome (NICR), tantalum nitride (TAN), chrome silicide ($CRSI_2$), chrome silicide nitride (CRSIN), chrome silicon oxide (CRSIO), or the like is used as a material of the metal thin film resistance element.

In a semiconductor device having the metal thin film resistance element, in order to meet the demand of high integration, the metal thin film resistance element may be frequently formed by a thin film having a thickness equal to or less than 100 nm (1000 Å) so that a high sheet resistance is obtained.

In the related art, as a method for making electric connection of such a metal thin film resistance element, a method whereby a wiring pattern is formed on a lower layer side insulation film; a base insulation film is formed on the wiring pattern; a connection hole is formed in the base insulation film on the wiring patter; and the metal thin film resistance element is formed in the connection hole and on the base insulation film, has been used. See, for example, Japanese Laid-Open Patent Application Publication No. 2002-124639.

A related art semiconductor device is discussed with reference to FIG. 1 and FIG. 2. Here, FIG. 1 is a view showing the related art semiconductor device, more specifically, FIG. 1(A) is a plan view of the related art semiconductor device; FIG. 1(B) is a cross-sectional view taken along a line A-A of FIG. 1(A); and FIG. 1(C) is a cross-sectional view taken along a line B-B of FIG. 1(A). FIG. 2 is an equivalent circuit of FIG. 1(A).

Referring to FIG. 1 and FIG. 2, an interlayer insulation layer 5 is formed on an element isolation oxide film 3 formed on a silicon substrate 1. A metal wiring pattern 7 is formed on the interlayer insulation layer 5. A base insulation film 9 is formed on an entire surface of the interlayer insulation layer 5 including the metal wiring pattern 7.

A connection hole 45 is formed in the base insulation film 9 on the metal wiring pattern 7. A metal thin film resistance element 47 is formed on the base insulation film 9 including a forming area of the connection hole 45.

A passivation film 15 is formed on the base insulation film 9 including a forming area of the metal thin film resistance element 47 as a final protection film.

As shown in FIG. 1(B), a lower surface of the metal thin film resistance 47 is electrically connected to the metal wiring pattern 7 in the connection hole 45.

In addition, as shown in FIG. 1(A), plural metal thin film resistance elements 47 are connected in series via the metal wiring patterns 7.

The metal thin film resistance elements 47 form a unit resistance. This unit resistance is prepared in various connection ways such as a block of a series connection or a parallel connection of one metal thin film resistance element, two metal thin film resistance elements, four metal thin film resistance elements, eight metal thin film resistance elements, sixteen metal thin film resistance elements, thirty two metal thin film resistance elements, sixty four metal thin film resistance element and so on. A single or plural of these blocks are connected so that a splitting resistance circuit or the like necessary for the circuit is formed.

In the examples shown in FIG. 1 and FIG. 2, the metal thin film resistance elements 47 of a single resistance R1, two resistances R2, and four resistances R3 are connected in series and the resistances R1, R2, and R3 are connected in series. When a voltage is applied between electrodes A through D, voltages corresponding to a resistance ratio of electrodes B and C are output.

According to a connection method shown in FIG. 1, a substantial resistance value including resistance of an electrode per se, contact resistance of the electrode and the metal thin film resistance element, or the like substantially follows the number of the metal thin film resistance elements. Therefore, it is possible to easily design and avoid unevenness of resistance values.

Meanwhile, the analog integrated circuit requires a lay-out using a metal thin film resistance element having width as narrow as possible so that a large number of the metal thin film resistances are arranged. Therefore, the metal thin film resistance element is formed in an area close to the minimum resistance element pattern width that can be formed by a semiconductor process for manufacturing the analog integrated circuit.

However, in a case where a hole for connecting or an electrode is formed by the metal thin film resistance element whose lay-out is made in the vicinity of the minimum width, if a sufficient space of overlapping between the connection hole and the metal thin film resistance element is necessary, the connection hole may not be received in the width of a single metal thin film resistance element due to the size of the connection hole formed by a minimum size of the same process rule.

There are generally two methods as discussed below to correspond to this case.

(1) Only the connection hole forming part of the metal thin film resistance element is made wide.

(2) As shown in FIG. 3, the structure where a single metal thin film resistance element 47 is connected as the unit resistance is not applied, but a meandering metal thin film resistance element is formed by connecting two belt shape parts 47a with a turning part 47b, and a connection hole 45a and the metal wiring pattern 7 are arranged under the turning part 47b. Here, FIG. 3 is a plan view showing another related art semiconductor device.

In the case of the above-mentioned (1), since the metal thin film resistance element of the connection hole part is wide, the area of the lay-out of the metal thin film resistance element is increased.

On the other hand, in the case of the above-mentioned (2), since the connection hole 45a is arranged under the turning part 47b connected to two belt shape parts 47a, it is possible to make the connection hole 45a larger than the width of the belt shape part 47a without increasing the lay-out area.

In addition, since the connection hole 45a and the metal wiring pattern 7 are provided at both ends of a single belt shape part 47a, the resistance values corresponding to the number of the belt shape parts 47a may be easily obtained.

However, in the lay-out of the above-mentioned (2), as shown by an arrow in FIG. 3, at the turning part 47b of the metal thin film resistance element, the electrical current flows not to the connection hole 45a or the metal wiring pattern 7 but via an overlapping space part. For example, at extended parts such as the electrodes A through D, an electric current flows via the connection hole and the electrode part and therefore a designated resistance value or resistance ratio is not obtained. Such a problem may occur more frequently as the number of the belt shape part 47a and the turning part 47b connected in series is increased.

SUMMARY

In an aspect of this disclosure, there is provided a semiconductor device having an integrated circuit including a metal thin film resistance element wherein a resistance value that is the same as a design value can be obtained without increasing a lay-out area of the metal thin film resistance element.

In another aspect of this disclosure, there is provided a semiconductor device that includes: a lower layer side insulation film; a wiring pattern formed on the lower layer side insulation film; a base insulation film formed on the lower layer side insulation film and the wiring pattern; and a plurality of metal thin film resistance elements formed on the base insulation film; wherein a connection hole is formed in the base insulation film on the wiring pattern; the wiring pattern and the metal thin film resistance element are electrically connected in the connection hole; the metal thin film resistance element has a belt shape part arranged separately from the connection hole and a connection part continuously formed with the belt shape part and connected to the wiring pattern in the connection hole; and the connection parts of at least two of the metal thin film resistance element are formed in the single connection hole with a gap in between said connection parts.

According to the above-mentioned semiconductor device, it is possible to make the connection hole larger than the width of the belt shape part and therefore an area of the lay-out is not increased.

As a result of this, it is possible to make lay-out of the metal thin film resistance elements without limiting the size of the connection hole. Hence, it is possible to make the area of the lay-out small and a chip size small.

In addition, since plural connection parts formed in a single connection hole are formed with a gap in between, electrical current flows via the wiring pattern if plural metal thin film resistance elements are connected in series. Therefore, in the embodiment of the present invention, unlike the related art shown in FIG. 3, the electrical current does not flow via the turning part 47b so that a designated resistance value is obtained and an analog circuit having high precision can be designed.

In the semiconductor device, the connection part may be wider than the belt shape part.

According to the above-mentioned semiconductor device, it is possible to make a space of overlapping of the connection part and the connection hole large.

In the semiconductor device, the gap between the connection parts neighboring in the connection hole may be narrower than a gap between neighboring belt shape parts.

According to the above-mentioned semiconductor device, as compared with a case where the gap between the neighboring connection parts is the same as the gap between the neighboring belt-shape parts, it is possible to make a contact area of the metal thin film and the wiring pattern larger so that the contact resistance can be reduced.

The semiconductor device may further include a first connection part made of a metal thin film whose material is the same as the material of the metal thin film resistance element, which first connection part is configured to connect the connection parts neighboring in the connection hole.

According to the above-mentioned semiconductor device, it is possible to make a contact area of the metal thin film and the wiring pattern larger so that the contact resistance can be reduced.

The semiconductor device may further include a second connection part made of a metal thin film whose material is the same as the material of the metal thin film resistance element, which second connection part is configured to connect the connection parts neighboring outside the connection hole at a side opposite to the belt shape part from the connection hole.

According to the above-mentioned semiconductor device, it is possible to reduce influence where the end part of the connection part is curved due to properties of photo engraving so that the width of the overlapping part can be made large.

In another aspect of this disclosure, a semiconductor device includes a splitting resistance circuit configured to obtain high precision of a voltage output by splitting the voltage output with a plurality of resistance elements and adjusting the voltage output by cutting a fuse element; wherein the resistance element is formed by the metal thin film resistance element mentioned above.

According to the above-mentioned semiconductor device, it is possible to make the resistance value of the resistance element stable by using the metal thin film resistance elements forming the semiconductor device of the embodiment of the present invention. Therefore, it is possible to improve precision of output voltage of a splitting resistance circuit.

In another aspect of this disclosure, there is provided a semiconductor device that includes: a first splitting resistance circuit configured to split an input voltage and supply a split voltage; a standard voltage generation circuit configured to supply a standard voltage; and a voltage detection circuit having a comparison circuit configured to compare the split voltage from the first splitting resistance circuit and the standard voltage from the standard voltage generation circuit; wherein the first splitting resistance circuit has the splitting resistance circuit mentioned above.

According to the above-mentioned semiconductor device, it is possible to improve precision of the output voltage by the splitting resistance circuit where the present invention is applied. Therefore, it is possible to improve the precision of voltage detection of the voltage detection circuit.

In another aspect of this disclosure, there is provided a semiconductor device that includes: an output driver configured to control output of an input voltage; a first splitting resistance circuit configured to split an output voltage and supply a split voltage; a standard voltage generation circuit configured to supply a standard voltage; and a constant voltage generation circuit having a comparison circuit configured to compare the split voltage from the first splitting resistance circuit and the standard voltage from the standard voltage generation circuit; wherein the first splitting resistance circuit has the splitting resistance circuit mentioned above.

According to the above-mentioned semiconductor device, it is possible to improve the precision of the output voltage by the splitting the resistance circuit where the present invention is applied. Therefore, it is possible to make output voltage of the constant voltage generation circuit stable.

The above-mentioned and other aspects, features, and advantages will become more apparent from the following detailed description when read in conjunction with the accompanying drawings.

BRIEF DESCRIPTION OF THE DRAWINGS

FIG. 1(A) is a plan view of the related art semiconductor device; FIG. 1(B) is a cross-sectional view taken along a line A-A of FIG. 1(A); and FIG. 1(C) is a cross-sectional view taken along a line B-B of FIG. 1(A);

FIG. 4(A) is a plan view showing a part of a forming area of a metal thin film resistance element; FIG. 4(B) is a cross-sectional view taken along a line A-A of FIG. 4(A); and FIG. 4(C) is a cross-sectional view taken along a line B-B of FIG. 4(A);

FIG. 11(A) is a graph in a case of the present invention and FIG. 11(B) is a graph of a comparison example wherein the vertical axis shows frequency and the horizontal axis shows an output voltage.

BEST MODE FOR CARRYING OUT THE INVENTION

A description of the present invention is now given, with reference to FIG. 4 through FIG. 11, including embodiments of the present invention.

Figure 4:
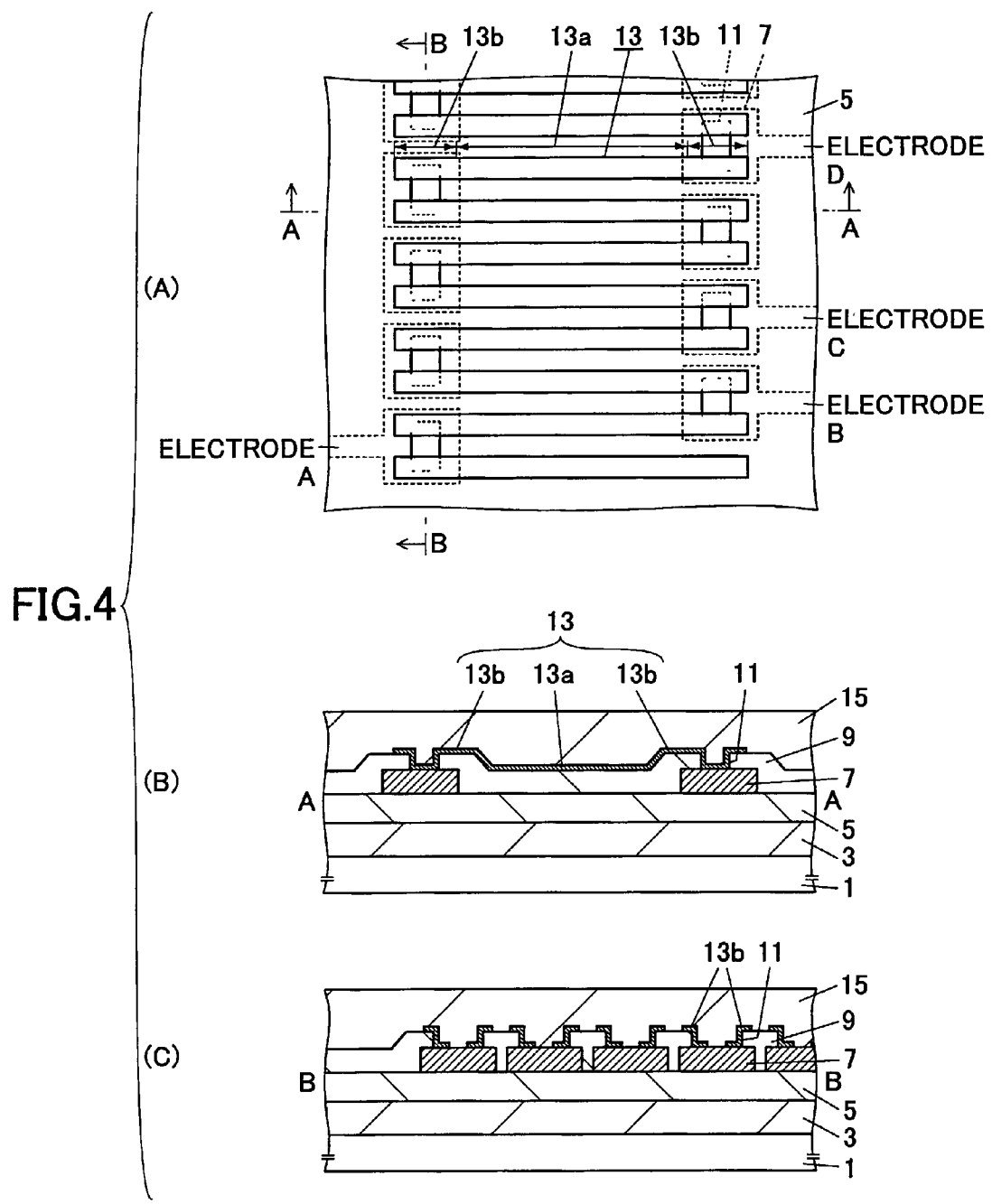
FIG. 4 is a view showing a semiconductor device of an embodiment of the present invention, more specifically.

FIG. 4 is a view showing a semiconductor device of an embodiment of the present invention. More specifically, FIG. 4(A) is a plan view showing a part of a forming area of a metal thin film resistance element; FIG. 4(B) is a cross-sectional view taken along a line A-A of FIG. 4(A); and FIG. 4(C) is a cross-sectional view taken along a line B-B of FIG. 4(A).

In FIG. 4(A), illustrations of a base insulation film and a passivation film are omitted. In the embodiment discussed below, while a transistor element, a capacitor element, or the like is formed on the same substrate, illustration of these elements is omitted in drawings.

Figure 2:
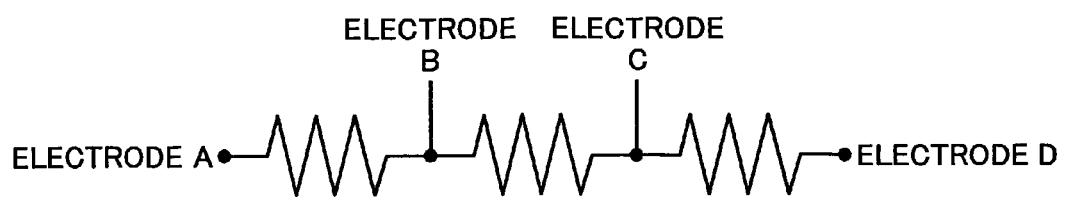
FIG. 2 is an equivalent circuit of FIG. 1(A), FIG. 3 and FIG. 4(A)

An equivalent circuit of this embodiment is the same as the circuit shown in FIG. 2.

In this embodiment, an element isolation oxidization film 3 is formed on a silicon substrate 1. An interlayer insulation film (lower layer side insulation film) 5 is formed on the element isolation oxidization film 3 formed on the silicon substrate 1.

The interlayer insulation film 5 is made of a BPSG (Borophospho Silicate Glass) film or a PSG (Phospho Silicate Glass) film. A metal wiring pattern 7 is formed on the interlayer insulation film 5. The metal wiring pattern is formed by, for example, an AlSiCu (Cu=0.5%, Si=1.0%) film.

A base insulation film 9 is formed on the interlayer insulation film 5 including a forming area of the metal wiring pattern 7. The base insulation film 9 is formed by, for example, from a lower layer side, a plasma CVD (Chemical Vapor Deposition) oxidization film and a SOG (Spin On Glass) layer. These layers are illustrated in a body in FIG. 4. The thickness of the base insulation film 9 is, for example, approximately 650 nm (6500 Å).

A connection hole 11 is formed in the base insulation film 9 so as to correspond to a connection part of a metal thin film resistance element and the metal wiring pattern 7. The connection hole 11 has measurement of, for example, approximately 2.6×1.4 µm.

A CrSiN thin film resistance element (metal thin film resistance element) 13 is formed on the base insulation film 9 including a forming area of the connection hole 11. The CrSiN thin film resistance element 13 includes a band shape part 13a and connection parts 13b provided at both ends of the band shape part 13a.

The band shape part 13a is arranged so as to be separated from the connection hole 11. The connection part 13b is formed from the end part of the band shape part 13a into the connection hole 11. In the connection hole 11, the connection part 13b is electrically connected to the metal wiring pattern 7. In a single connection hole 11, the connection parts 13b of two CrSiN thin film resistance resistances 13 are formed with a gap in between.

The film thickness of the CrSiN thin film resistance element 13 is, for example, approximately 8 nm (80 Å). The CrSiN thin film resistance element 13 is formed by a target of Si/Cr=60/40 wt % under a condition of $N_2$ partial pressure=20%. The width of the CrSiN thin film resistance element 13 is, for example, approximately 1.2 µm. The gap between neighboring CrSiN thin film resistance elements 13 is, for example, approximately 1.0 µm.

A passivation film 15 as a final protection film is formed on the base insulation film 9 including a forming area of the CrSiN thin film resistance element 13. The passivation film 15 is formed by, for example, a silicon oxide film situated at a lower layer side and a silicon nitride layer situated at an upper layer side. These layers are illustrated in a body in FIG. 4.

Thus, in this embodiment, the CrSiN thin film resistance element 13 includes the belt shape part 13a arranged separately from the connection hole 11 and the connection part 13b continuously formed with the belt shape part 13a and connected to the metal wiring pattern 7. In addition, the connection parts 13b of two CrSiN thin film resistance elements 13 are formed with a gap in between in a single connection hole 11.

Therefore, the connection hole 11 can be larger than the width of the belt shape part 13a and therefore the area of the lay-out is not increased. Because of this, since the lay-out of the CrSiN thin film resistance element 13 can be made without limiting the size of the connection hole 11, it is possible to make the area of the lay-out small so that the chip size can be made small.

In addition, since two connection parts 11a formed in a single connection hole 11 are formed with a gap in between, an electrical current flows via the wiring pattern 7 when plural metal thin film resistance elements 13 are connected in series.

Figure 3:
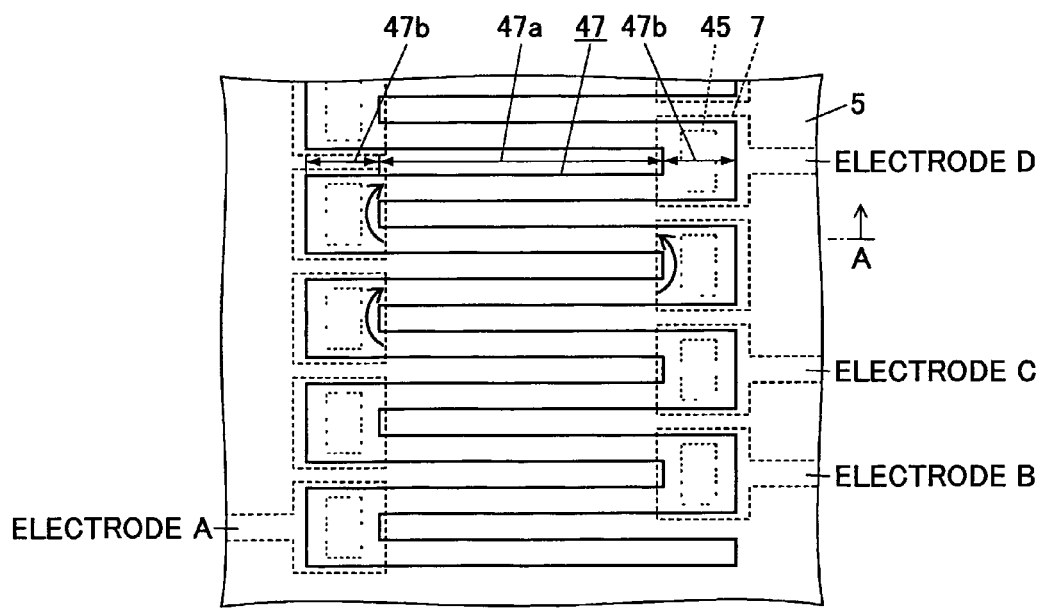
FIG. 3 is a plan view showing another related art semiconductor device.

Accordingly, in this embodiment unlike the related art shown in FIG. 3, the electrical current does not flow via the turning part 47b so that a designated resistance value is obtained and an analog circuit having high precision can be designed.

Figure 5:
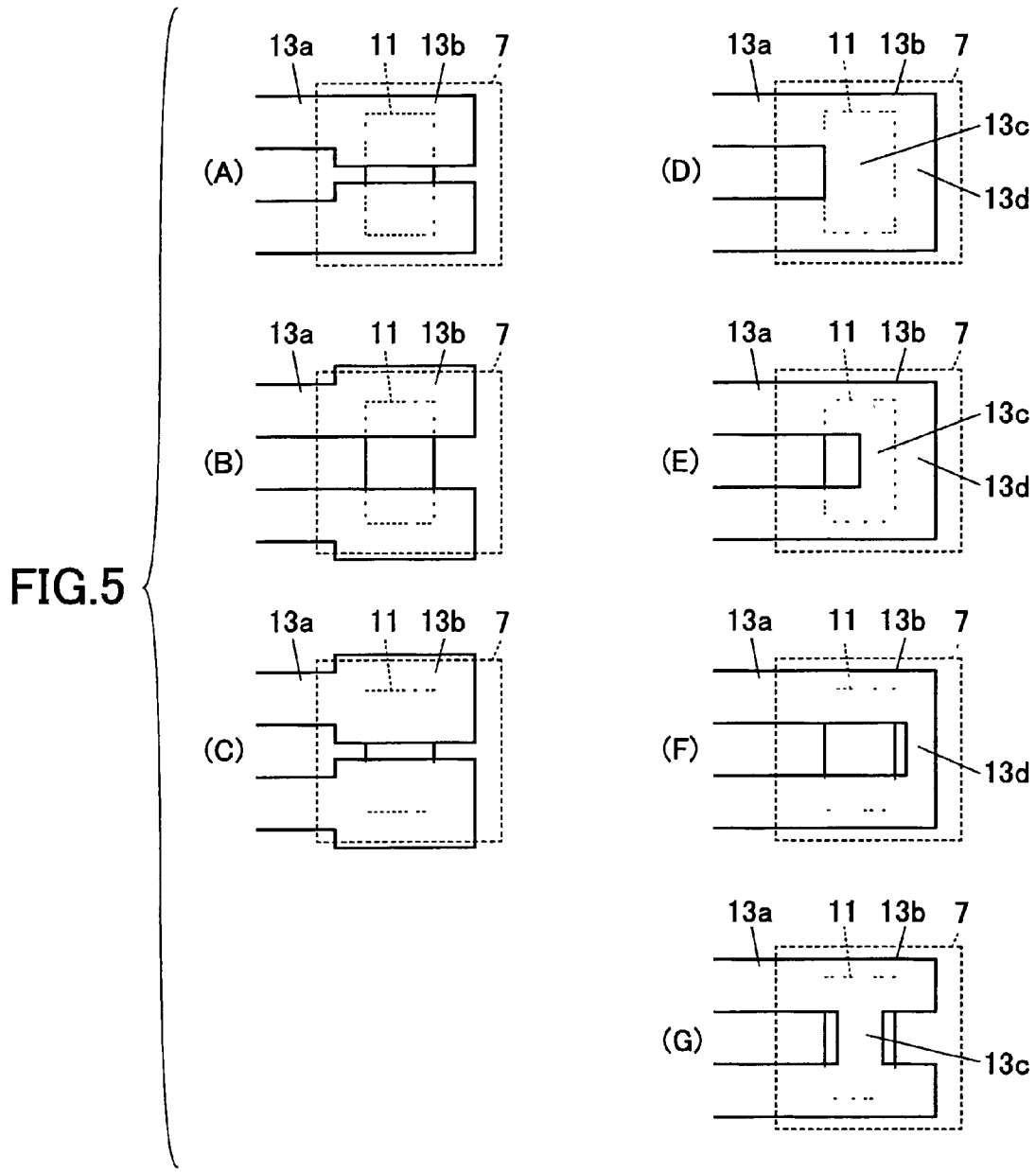
FIG. 5 is a plan view showing the vicinity of a connection hole of other embodiments of the present invention.

FIG. 5 is a plan view showing the vicinity of a connection hole of other embodiments of the present invention;

In an example shown in FIG. 5(A), the width of the connection part 13b is greater than the width of the belt shape part 13a so that the gap between the connection parts 13b neighboring in the connection hole 11 is narrower than the gap between the belt shape parts 13a neighboring the connection hole 11.

According to the example shown in FIG. 5(A), as compared to a case where the gap between the connection parts 13b neighboring in the connection hole 11 is the same as the gap between the belt shape parts 13a neighboring the connection hole 11, it is possible to make a contact area of the connection part 13b and the wiring pattern 7 larger so that contact resistance can be reduced.

In addition, since the width of the connection part 13b is greater than the width of the belt shape part 13a, it is possible to make an overlapping space of the connection part 13b and the connection hole 11.

In an example shown in FIG. 5(B), a side in a longitudinal direction of the connection part 13b and not overlapping the connection hole 11 is extended to the outside, namely in a direction opposite to the connection hole 11 so that the connection part 13b is wider than the belt shape part 13a.

According to the example shown in FIG. 5(B), it is possible to make the overlapping space of the connection part 13b and the connection hole 11 large.

In an example shown in FIG. 5(C), a configuration of the connection part 13b is formed by combining the configuration of the connection part 13b in the example shown in FIG. 5(A) and the configuration of the connection part 13b in the example shown in FIG. 5(B).

According to the example shown in FIG. 5(C), it is, possible to realize a decrease of the contact resistance and an increase of the overlapping space of the connection part 13b and the connection hole 11.

In an example shown in FIG. 5(D), a first connection part 13c and a second connection part 13d are provided. The first connection part 13c connects connection parts 13b neighboring in the connection hole 11. The second connection part 13d connects connection parts 13b neighboring outside of the connection hole 11 at a side opposite to the belt shape part 13a from the connection hole 11.

The first connection part 13c and the second connection part 13d are made of a metal thin film whose material is the same as that of the CrSiN thin film resistance element 13, namely CrSiN.

According to the example shown in FIG. 5(D), it is possible to make the contact area of the metal thin film and the wiring pattern 7 large by the first connection part 13c so that contact resistance can be reduced.

In addition, it is possible to reduce influence where the end part of the connection part 13b is curved due to properties of photo engraving by the second connection part 13d so that width of the overlapping part can be made large.

In an example shown in FIG. 5(E) as compared to the example shown in FIG. 5(D), the connection part 13c is formed so as to retreat from the belt shape part 13a.

According to the example shown in FIG. 5(E), even if an overlapping shift is generated in a longitudinal direction of the belt shape part 13a, it is possible to prevent the belt shape parts 13a from being connected by the connection part 13c at a belt shape part 13a side of the connection hole 11.

In an example shown in FIG. 5(F) as compared to the example shown in FIG. 5(D), the connection part 13c is not formed.

According to the example shown in FIG. 5(F), it is possible to reduce influence where the end part of the connection part 13b is curved due to properties of photo engraving by the second connection part 13d so that width of the overlapping part can be made large.

In an example shown in FIG. 5(G) as compared to the example shown in FIG. 5(E), the second connection part 13d is not formed.

According to the example shown in FIG. 5(G), it is possible to make the contact area of the metal thin film and the wiring pattern 7 large by the first connection part 13c so that contact resistance can be reduced.

In the example shown in FIG. 5(G) as well as the example shown in FIG. 5(D), the connection part 13c may be formed to be the same size as that of the connection hole 11 in a longitudinal direction of the belt shape part 13a. However, considering an overlapping space, it is preferable that at least an end part at a side of the belt shape part 13a be formed so as to retract from the connection part 13c.

In addition, in the examples shown in FIG. 5(D), FIG. 5(E), FIG. 5(F) and FIG. 5(G) as well as the examples shown in FIG. 5(A), FIG. 5(B), and FIG. 5(C), line width of the connection part 13b may be greater than the belt shape part 13a so as to have the same effect as that of the examples shown in FIG. 5(A), FIG. 5(B), and FIG. 5(C).

In the above-discussed embodiment, two connection parts 13b are formed in a single connection hole 11. However, the present invention is not limited to this. The number of the connection parts of the metal thin film resistance element formed in a single connection hole may be equal to or greater than three.

Figure 6:
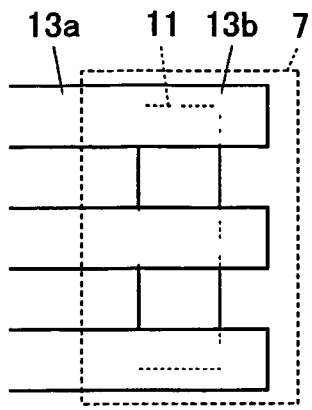
FIG. 6 is a plan view showing the vicinity of a connection hole of other embodiment of the present invention.

For example, as shown in FIG. 6, three connection parts 13b may be formed in a single connection hole 11. Here, FIG. 6 is a plan view showing the vicinity of a connection hole of another embodiment of the present invention.

In a case where the number of the connection parts of the metal thin film resistance element formed in a single connection hole is equal to or greater than three, the linear width of the connection part 13 may be wide as shown in FIG. 5(A), FIG. 5(B) and FIG. 5(C); the connection parts 13c and 13d may be provided as shown in FIG. 5(D), FIG. 5(E), FIG. 5(F) and FIG. 5(G); or they may be combined.

In the above-discussed embodiment, the passivation film 15 is formed on the CrSiN thin film resistance element 13. However, the present invention is not limited to this. The insulation film formed on the CrSiN thin film resistance element 13 may be any insulation film such as an interlayer insulation film for forming a metal wiring pattern of a second layer.

In the above-discussed embodiment, the present invention is applied to the semiconductor device having a single layer of the metal wiring pattern. However, the present invention is not limited to this. The present invention may be applied to a semiconductor device with a multilayer metal wiring structure having two or more layers of the metal wiring patterns. In this case, in order to obtain electrical connection of the metal thin film resistance element, the metal wiring of a lower layer of the metal thin film resistance element may be a metal wiring pattern of any layer.

In the above-discussed embodiment, a metal material pattern 7 is used as a wiring pattern for making electrical connection of the CrSiN thin film resistance element. However, the present invention is not limited to this. For example, a wiring pattern made of other metal material or a polysilicon wiring pattern made of polysilicon may be used.

In the above-discussed embodiment, CrSiN is used as the material of the metal thin film resistance element. However, the present invention is not limited to this. Other material such as NiCr, TaN, $CrSi_2$, CrSi, or CrSiO may be used as the material of the metal thin film resistance element.

The metal thin film resistance element forming the semiconductor device of the embodiment of the present invention can be applied to a semiconductor device having, for example, an analog circuit. In the following description, an example of a semiconductor device having an analog circuit including the metal thin film resistance element of the embodiment of the present invention is discussed.

Figure 7:
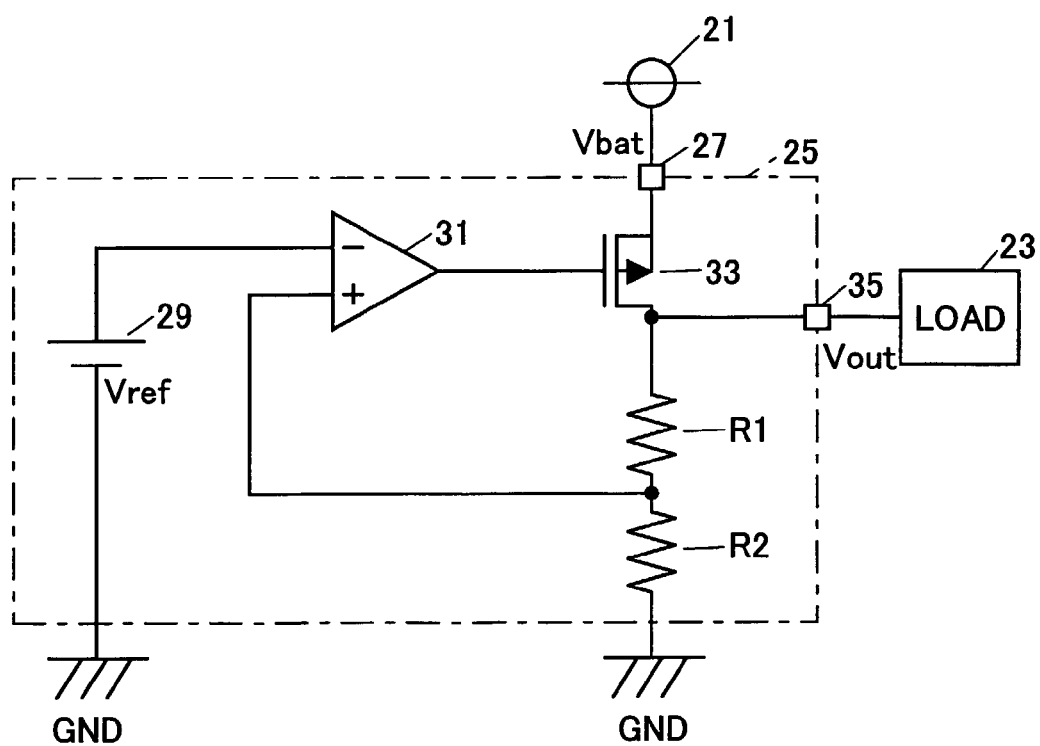
FIG. 7 is a circuit diagram showing an example of a semiconductor device having a constant voltage generation circuit that is an analog circuit.

FIG. 7 is a circuit diagram showing an example of a semiconductor device having a constant voltage generation circuit that is an analog circuit.

Referring to FIG. 7, a constant voltage generation circuit 25 is provided so as to stably supply electric power from a DC (direct current) power supply 21 to a load 23. The constant voltage generation circuit 25 includes an input terminal (Vbat) 27 where the DC power supply 21 is connected, a standard voltage generation circuit (Vref) 29, an operational amplifier (comparison circuit) 31, a P channel MOS transistor (hereinafter "PMOS") 33 forming an output driver, splitting resistance elements R1 and R2, and an output terminal (Vout) 35.

In the operational amplifier 31 of the constant voltage generation circuit 25, the following control is implemented. That is, the output terminal is connected to a gate electrode of the PMOS 33; a standard voltage Vref is applied from the standard voltage generation circuit 29 to an inversing input terminal (−); and a voltage produced by dividing the output voltage Vout with the resistance elements R1 and R2 is applied to a non-inverting input terminal (+), so that the split voltage of the resistance elements R1 and R2 becomes equal to the standard voltage Vref.

Figure 8:
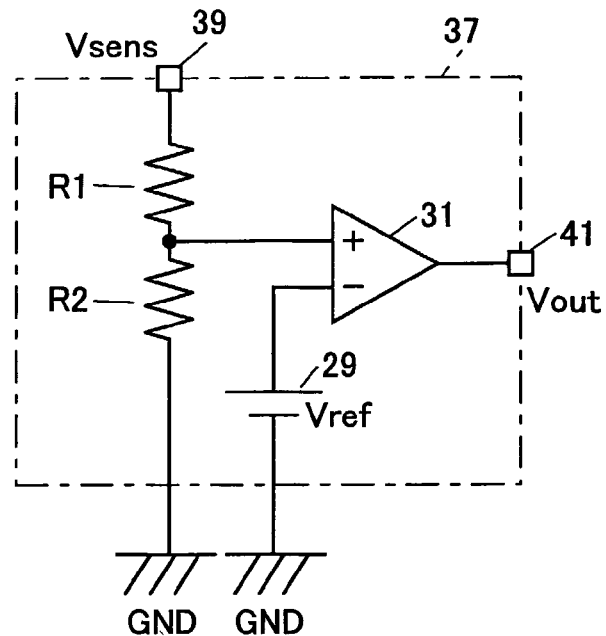
FIG. 8 is a circuit diagram showing an example of a semiconductor device having a voltage generation circuit that is an analog circuit.

FIG. 8 is a circuit diagram showing an example of a semiconductor device having a voltage generation circuit that is an analog circuit.

Referring to FIG. 8, in a voltage detection circuit 37, the numerical reference 31 denotes an operational amplifier. The standard voltage generation circuit 29 is connected to a inverting input terminal (−) so that the standard voltage Vref is applied. A voltage of a terminal to be measured, which voltage is input from the input terminal (Vsens) is divided by the splitting resistance elements R1 and R2 so that the divided voltage is input to the non-inverting input terminal (+) of the operational amplifier 31. The output of the operational amplifier 31 is output to the outside via the output terminal (Vout) 41.

In the voltage detection circuit 37, if the voltage at the terminal to be measured is high so that the voltage divided by the splitting resistance elements R1 and R2 is higher than the standard voltage Vref, an H level of the output of the operational amplifier 31 is maintained.

If the voltage at the terminal to be measured is decreased so that the voltage divided by the splitting resistance elements R1 and R2 is equal to or less than the standard voltage Vref, the output of the operational amplifier 31 becomes an L level.

Generally, in the constant voltage generation circuit shown in FIG. 7 and the voltage detection circuit shown in FIG. 5, the standard voltage Vref from the standard voltage generation circuit is changed due to unevenness of a manufacturing process. Therefore, in order to respond to this change, the resistance value of the splitting resistance elements is adjusted by using a resistance element circuit (hereinafter "splitting resistance circuit") whereby the resistance value can be adjusted by cutting a fuse element as a splitting resistance element or by using a splitting resistance circuit whereby the resistance value can be adjusted by laser irradiation onto the resistance element.

Figure 9:
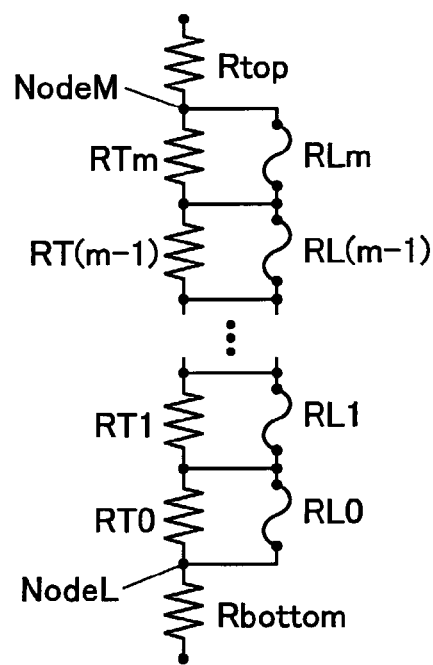
FIG. 9 is a circuit diagram showing an example of a semiconductor device having a splitting resistance circuit that is an analog circuit.
Figure 10:
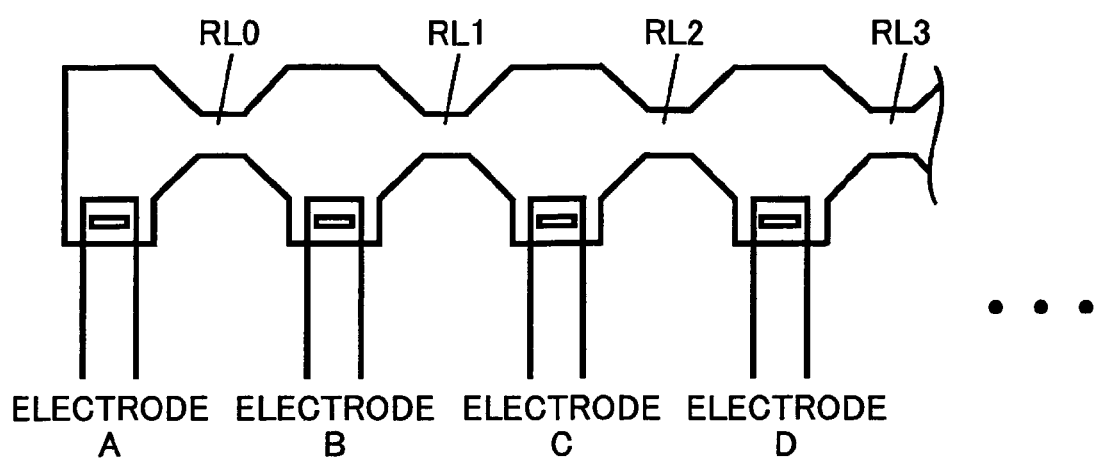
FIG. 10 is a lay-out view of an example of a lay-put of a fuse element part of the splitting resistance circuit.

FIG. 9 is a circuit diagram showing an example of a semiconductor device having a splitting resistance circuit that is an analog circuit. FIG. 10 is a plan view of an example of a lay-out of a fuse element part of the splitting resistance circuit. The lay-out of the resistance element part is the same as that shown in FIG. 4(A).

As shown in FIG. 9, a resistance element Rbottom, "m+1 ("m" is a positive integer)" pieces of resistance elements RT, RT1, . . . , RTm, and a resistance element Rtop are connected in series. Corresponding to the resistance elements, fuse elements RL0, RL1, . . . , RLm are connected in parallel to the corresponding resistance elements RT, RT1, . . . , RTm.

FIG. 10 is a plan view of an example of a lay-out of a fuse element part of the splitting resistance circuit.

As shown in FIG. 10, the fuse elements RL0, RL1, . . . , RLm are formed by a polysilicon pattern having sheet resistance of, for example, approximately 20Ω through 40 Ω.

Values of the resistance elements RT, RT1, . . . , RTm are increased in a binary number manner from a side of the resistance element Rbottom. In other words, the resistance value of the resistance element RTn is 2n times the unit value that is the resistance value of the resistance elements RT0.

In FIG. 4 and FIG. 10, electrical connection between the electrodes A-A, electrodes B-B, electrodes C-C, and electrodes D-D are made by the metal wiring pattern.

Thus, in the splitting resistance circuit wherein precision of the ratio between the resistance element is critical, in order to improve forming precision in the manufacturing process, unit resistance elements made of a couple of the resistance elements and the fuse elements are connected in series and arrange in a ladder structure.

In such a splitting resistance circuit, by cutting optional fuse elements RL0, RL1, . . . , RLm with a laser light, it is possible to obtain a desirable series resistance value.

As discussed above, with the metal thin film resistance element forming the semiconductor device of the embodiment of the present invention, it is possible to make the resistance value of the resistance element stable. Therefore, it is possible to improve the precision of the output voltage of the splitting resistance circuit shown in FIG. 9.

Figure 1:
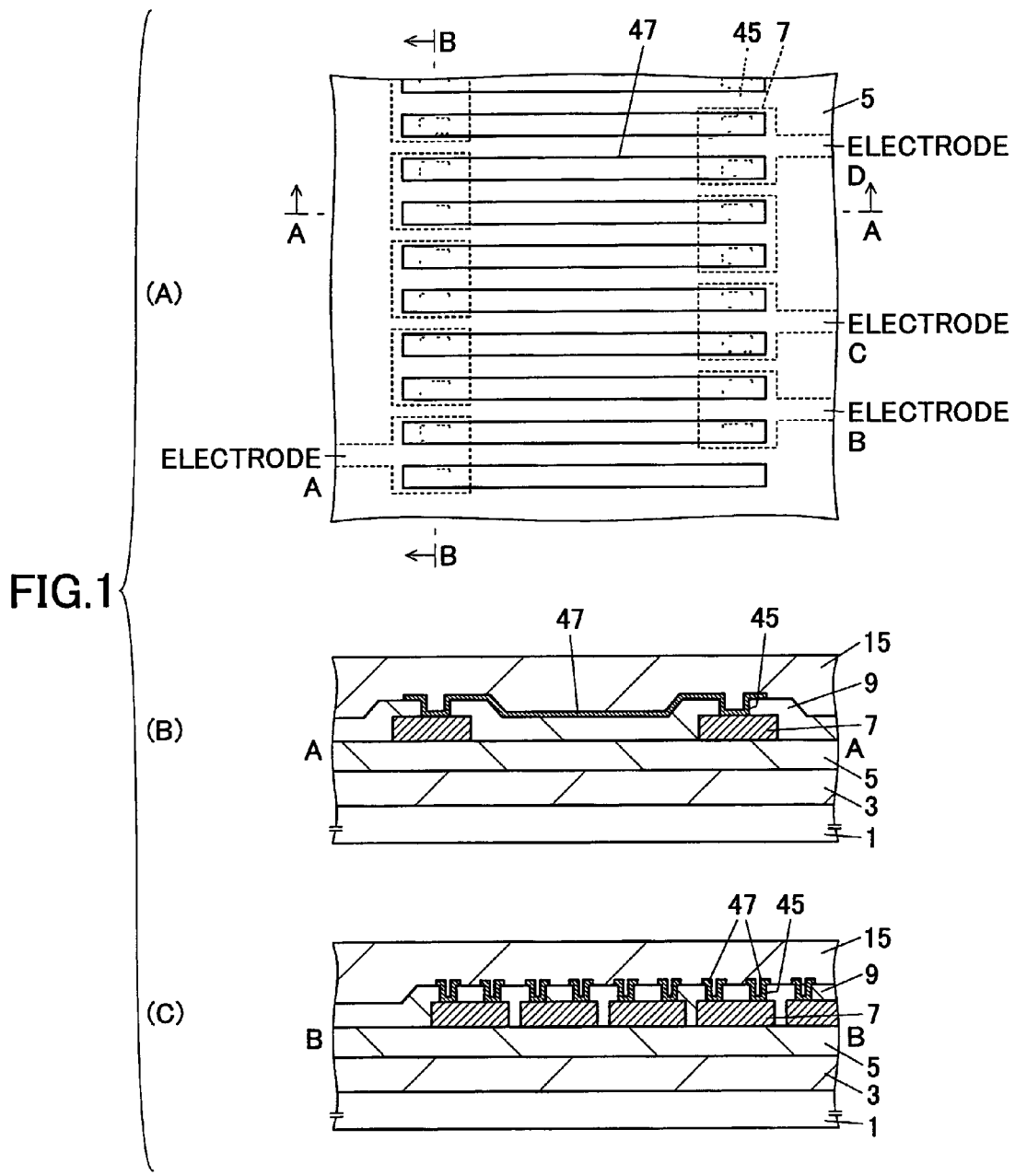
FIG. 1 is a view showing a related art semiconductor device, more specifically.

In a case where the splitting resistance circuit shown in FIG. 9 is applied to the splitting resistance elements R1 and R2 of the constant voltage generation circuit 25 shown in FIG. 1, for example, the end of the resistance element Rbottom is grounded and the end of the resistance element Rtop is connected to a drain of the PMOS 33.

In addition, a terminal NodeL between the resistance element Rbottom and RT0 or a terminal NodeM between the resistance element Rtop and RTm is connected to a non-inverting input terminal of the operational amplifier 31.

According to the splitting resistance circuit where the present invention is applied, it is possible to improve precision of the output voltage of the splitting resistance circuit. Therefore, it is possible to make the output voltage of the constant voltage generation circuit 25 stable.

In a case where the splitting resistance circuit shown in FIG. 9 is applied to the splitting resistance elements R1 and R2 of the voltage detection circuit 37 shown in FIG. 8, for example, the end of the resistance element Rbottom is grounded and the end of the resistance element Rtop is connected to the input terminal 61.

In addition, a terminal NodeL between the resistance element Rbottom and RT0 or a terminal NodeM between the resistance element Rtop and RTm is connected to a non-inverting input terminal of the operational amplifier 31.

According to the splitting resistance circuit where the present invention is applied, it is possible to improve precision of the output voltage of the splitting resistance circuit. Therefore, it is possible to improve the precision of the voltage detection ability of the voltage detection circuit 37.

Figure 11:
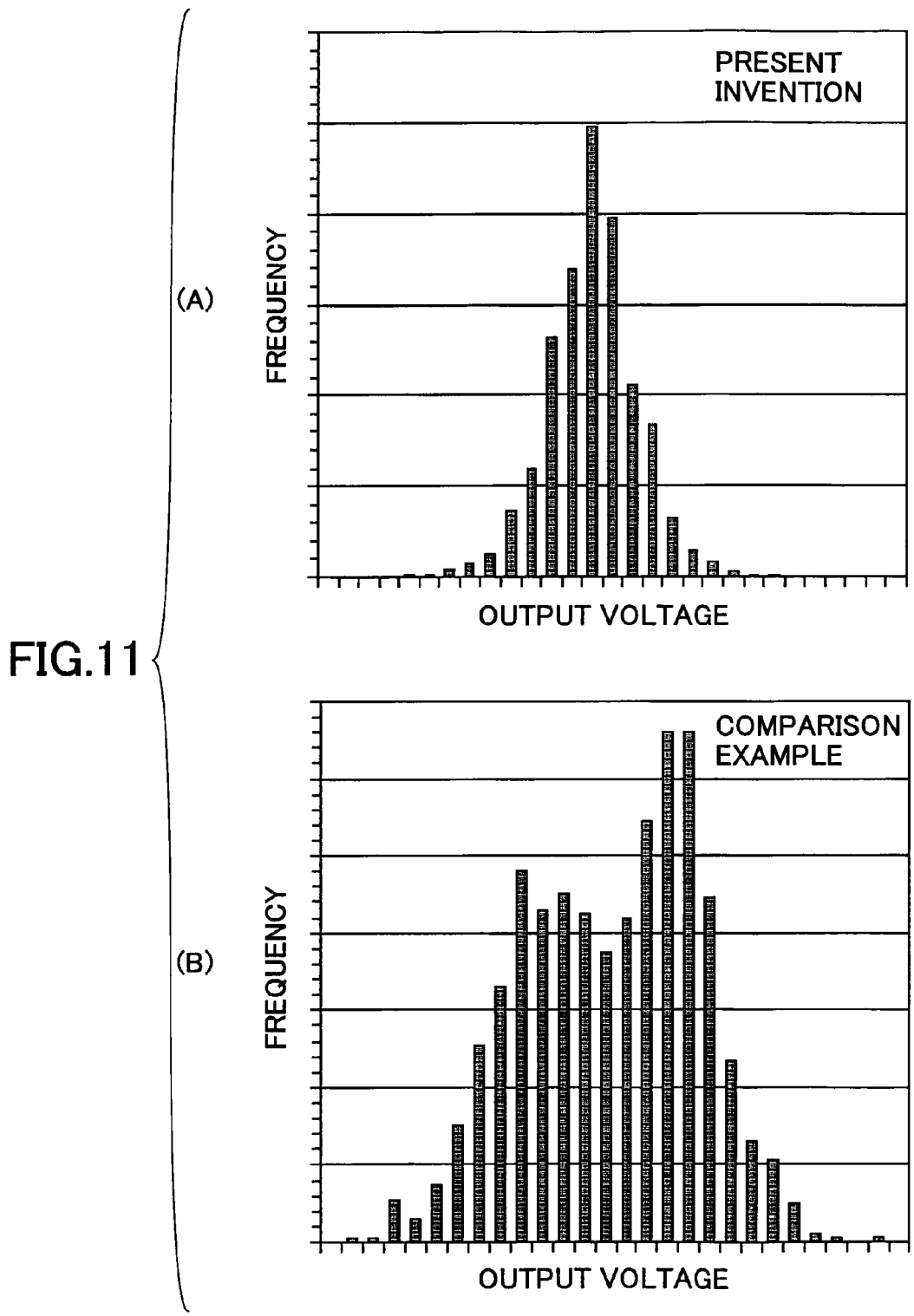
FIG. 11 is a graph showing an output voltage distribution after trimming in plural samples of the constant voltage generation circuit where the present invention is applied, more specifically.

FIG. 11 is a graph showing an output voltage distribution after trimming in plural samples of the constant voltage generation circuit where an embodiment of the present invention is applied. More specifically, FIG. 11(A) is a graph in a case of the present invention and FIG. 11(B) is a graph of a comparison example wherein the vertical axis shows frequency and the horizontal axis shows an output voltage.

A metal thin film resistance element of a sample in the case of FIG. 11(A) is formed under conditions of the example discussed with reference to FIG. 4.

A metal thin film resistance body of a comparison example of FIG. 11(B) includes the turning part of the related art discussed with reference to FIG. 3. Other conditions are same as the conditions of the embodiments discussed with reference to FIG. 4.

In the constant voltage generation circuit (A) where the present invention is applied, compared to the comparison example (B), standard deviation a is improved so as to be approximately half of the standard deviation of (B).

The present invention is not limited to these embodiments, but variations and modifications may be made without departing from the scope of the present invention.

While the examples of the semiconductor device where the splitting resistance circuit having the metal thin film resistance element of the present invention is applied is discussed with reference to FIG. 4 and FIG. 7 through FIG. 10, the semiconductor device where the splitting resistance circuit is applied is not limited to the semiconductor device having the constant voltage generation circuit or the semiconductor device having the voltage detection circuit. The present invention may be applied to any semiconductor device having the splitting resistance circuit.

In addition, the semiconductor device where the metal thin film resistance element of the present invention is applied is not limited to the semiconductor device having the splitting resistance circuit. The present invention may be applied to any semiconductor device having the metal thin film resistance element.

This patent application is based on Japanese Priority Patent Application No. 2005-299767 filed on Oct. 14, 2005, the entire contents of which are hereby incorporated by reference.

The invention claimed is:

1. A semiconductor device, comprising:
a lower layer side insulation film;
a wiring pattern formed on the lower layer side insulation film;
a base insulation film formed on the lower layer side insulation film and the wiring pattern; and
a plurality of metal thin film resistance elements formed on the base insulation film;
wherein a connection hole is formed in the base insulation film on the wiring pattern;
the wiring pattern and the metal thin film resistance element are electrically connected in the connection hole;
wherein each of the metal thin film resistance elements comprises
a belt shape part arranged separately from the connection hole and
a connection part continuously formed with one end of the belt shape part and connected to the wiring pattern in the connection hole; and
wherein for each of the connection parts of at least two respectively elements of the plurality of metal thin film resistance elements, a portion of the connection part is formed in the connection hole,
wherein a gap is between the connection parts neighboring in the connection hole, and
wherein the connection parts belong to respective separate metal thin film resistance elements.

2. The semiconductor device as claimed in claim 1, wherein the connection part is wider than the belt shape part.

3. The semiconductor device as claimed in claim 1, wherein the gap between the connection parts neighboring in the connection hole is narrower than another gap between neighboring belt shape parts.

4. The semiconductor device as claimed in claim 2, wherein the gap between the connection parts neighboring in the connection hole is narrower than another gap between neighboring belt shape parts.

5. The semiconductor device of claim 1, further comprising:
a splitting resistance circuit including a plurality of fuse elements connected in parallel to the plurality of metal thin film resistance elements, respectively, wherein the plurality of metal thin film resistance elements splits a voltage output and the voltage output is adjusted by cutting one or more of the fuse elements.

6. The semiconductor device of claim 2, further comprising:
a splitting resistance circuit including a plurality of fuse elements connected in parallel to the plurality of metal thin film resistance elements, respectively wherein the plurality of metal thin film resistance elements splits a voltage output and the voltage output is adjusted by cutting one or more of the fuse elements.

7. The semiconductor device of claim 3, further comprising:
a splitting resistance circuit including a plurality of fuse elements connected in parallel to the plurality of metal thin film resistance elements, respectively, wherein the plurality of metal thin film resistance elements splits a voltage output and the voltage output is adjusted by cutting one or more of the fuse elements.

8. The semiconductor device of claim 4, further comprising:
a splitting resistance circuit including a plurality of fuse elements connected in parallel to the plurality of metal thin film resistance elements, respectively, wherein the plurality of metal thin film resistance elements splits a voltage output and the voltage output is adjusted by cutting one or more of the fuse elements.

9. The semiconductor device as claimed in claim 5, further comprising:
a first splitting resistance circuit which splits an input voltage and supplies a split voltage;

a standard voltage generation circuit which supplies a standard voltage; and a voltage detection circuit having a comparison circuit which compares the split voltage from the first splitting resistance circuit and the standard voltage from the standard voltage generation circuit.

10. The semiconductor device as claimed in claim 5, further comprising:

an output drive which controls output of an input voltage;

a first splitting resistance circuit which splits an output voltage and supplies a split voltage;

a standard voltage generation circuit which supplies a standard voltage; and a constant voltage generation circuit having a comparison circuit which compares the split voltage from the first splitting resistance circuit and the standard voltage from the standard voltage generation circuit.

* * * * *